United States Patent [19]
Tanaka et al.

[11] Patent Number: 5,091,283
[45] Date of Patent: Feb. 25, 1992

[54] PHOTOCURABLE DIALLYL PHTHALATE RESIN COMPOSITION AND PRINTED CIRCUIT BOARD USING THE SAME

[75] Inventors: Isamu Tanaka, Yokosuka; Hitoshi Oka, Yokohama; Makio Watanabe, Fujisawa; Hiroshi Kikuchi, Zushi; Shinichiro Imabayashi, Yokohama; Yukihiro Taniguti, Chigasaki, all of Japan

[73] Assignee: Hitachi, Ltd., Tokyo, Japan

[21] Appl. No.: 499,706

[22] Filed: Mar. 27, 1990

[30] Foreign Application Priority Data

Mar. 29, 1989 [JP] Japan ................................. 1-075118

[51] Int. Cl.$^5$ .............................................. G03F 7/078
[52] U.S. Cl. .................................. 430/280; 430/288; 430/918; 430/286
[58] Field of Search ................ 430/280, 918, 288, 286

[56] References Cited

U.S. PATENT DOCUMENTS

| | | | |
|---|---|---|---|
| 3,726,679 | 4/1973 | Abolafia et al. | 430/280 |
| 3,989,618 | 11/1976 | Tsukada et al. | 430/280 |
| 4,247,623 | 1/1981 | Guild | 430/275 |
| 4,268,614 | 5/1981 | Ueyama et al. | 430/315 |
| 4,614,778 | 9/1986 | Kajiura et al. | 526/281 |
| 4,943,516 | 7/1990 | Kamayachi et al. | 430/280 |

FOREIGN PATENT DOCUMENTS 51-040451 11/1976 Japan.
52-030969 8/1977 Japan.
62-265321 11/1987 Japan.

*Primary Examiner*—Marion E. McCamish
*Assistant Examiner*—C. D. RoDee
*Attorney, Agent, or Firm*—Antonelli, Terry, Stout & Kraus

[57] ABSTRACT

A photo curable diallyl phthalate resin composition characterized by containing 0.1 to 10 parts by weight of an agent for preventing back side undesirable curing and 20 to 100 parts by weight of a filler per 100 parts by weight of a diallyl phthalate prepolymer is particularly suitable for a partly additive process for forming a solder resist effective for preventing back side undesirable curing by ultraviolet light and having resistance to release of substances from the solder resist for deteriorating properties of plated copper film as well as for giving good mechanical properties.

4 Claims, 3 Drawing Sheets

F I G. 3
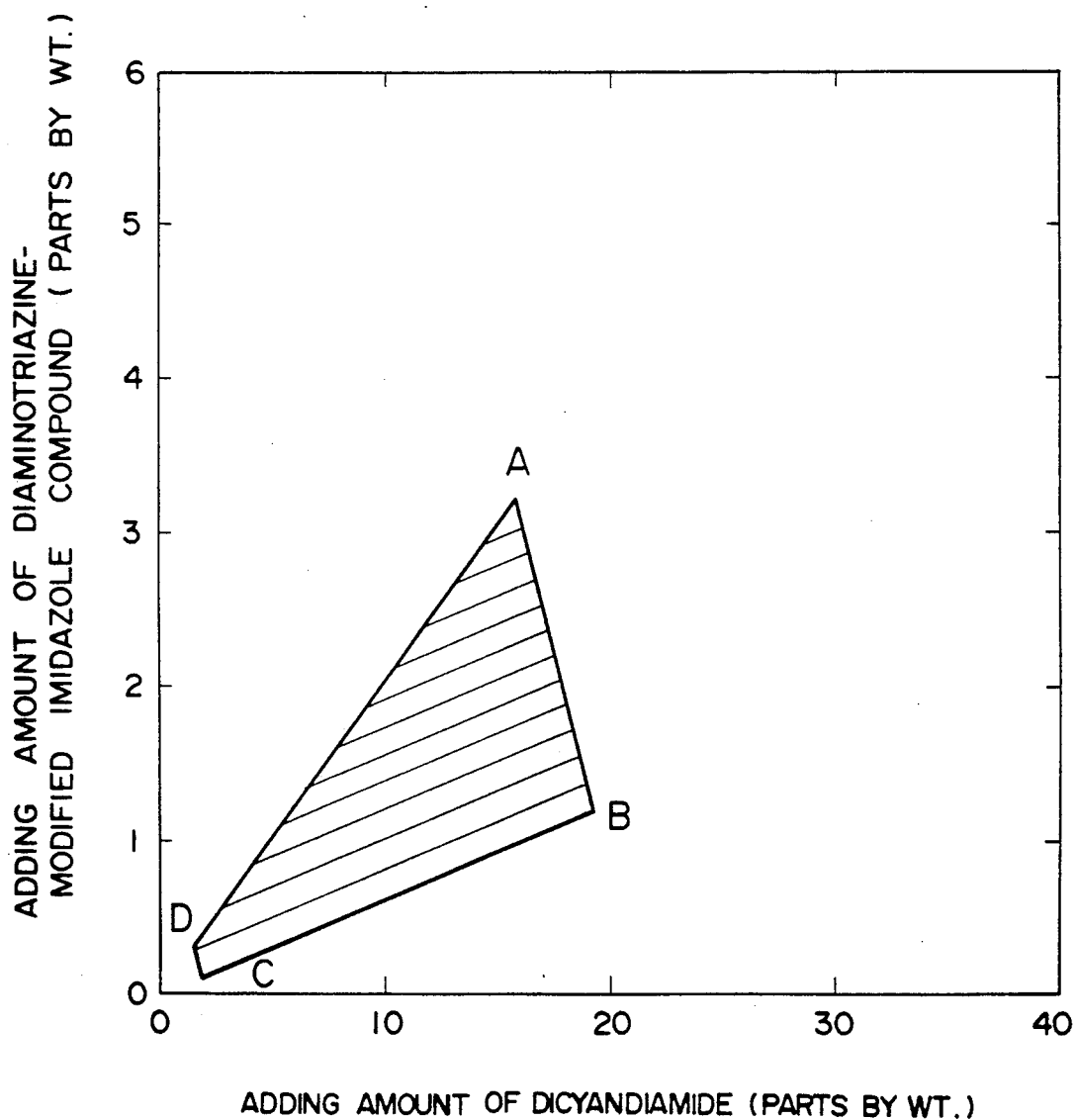

PHOTOCURABLE DIALLYL PHTHALATE RESIN COMPOSITION AND PRINTED CIRCUIT BOARD USING THE SAME

BACKGROUND OF THE INVENTION

The present invention relates to a photocurable diallyl phthalate resin composition usable for producing printed circuit boards and a process for producing a printed circuit board using said resin composition as an ultraviolet (UV) exposure developing type solder resist having resistance to peeling from a copper foil.

UV exposure developing type solder resists for printed circuit boards are disclosed, for example, in Japanese Patent Examined Publication Nos. 51-40451 and 52-30969, Japanese Patent Unexamined Publication Nos. 60-208377, 62-4390, and 62-253613, etc. These solder resists are mainly used in a subtractive process. On the other hand, plating resistant solder resists used in a so-called partly additive process are required to have quite different properties from those used in the subtractive process. Such solder resists are disclosed, for example, in Japanese Patent Unexamined Publication No. 58-147416.

But when a UV exposure developing type resist disclosed, for example, in Japanese Patent Examined Publication No. 52-30969 was used in the partly additive process, the resist had no resistance to peeling of the resist from a copper foil coated thereunder. On the other hand, when the solder resist disclosed in Japanese Patent Unexamined Publication No. 58-147416 was used, resistance to plating was good, but since it was not a UV exposure developing type, there was a problem in that highly precise patterns were not able to be formed.

In order to solve such problems, Japanese Patent Unexamined Publication No. 62-265321 discloses a resist composition usable for printed circuit boards comprising a prepolymer of diallyl phthalate, a polyfunctional unsaturated compound, a photopolymerization initiator, an epoxy resin, and a curing agent for the epoxy resin. Said composition may contain a filler, but the working examples disclosed in said patent publication contain no filler. The sholder resist obtained from said composition is good in resistance to alkaline plating, has a high degree of resolution and good workability, but poor in prevention of an effect of UV light reaching to a back side of a substrate coated with a resist on both sides when exposed to UV light (hereinafter referred to as "prevention of back side undesirable curing") and in resistance to release of substances from a resist in an electroless plating bath (hereinafter referred to as "resistance to release from a resist"), and inferior in heat resistance.

SUMMARY OF THE INVENTION

It is an object of the present invention to provide a photocurable diallyl phthalate resin composition for forming a solder resist excellent in prevention of back side undesirable curing, resistance to release from a resist and heat resistance as well as excellent in coating properties, resistance to adhesion to a negative mask when exposed to light, resistance to peeling of a resist, and electrical insulating properties.

It is another object of the present invention to provide a process for producing a printed circuit board using the resin composition as a solder resist.

It is a further object of the present invention to provide a printed circuit board thus produced.

The present invention provides a photocurable diallyl phthalate resin composition for forming a solder resist comprising
(a) 100 parts by weight of a prepolymer of diallyl phthalate,
(b) 4 to 30 parts by weight of a polyfunctional unsaturated compound,
(c) 0.5 to 12 parts by weight of a photopolymerization initiator,
(d) 3 to 35 parts by weight of an epoxy resin,
(e) 2 to 20 parts by weight per 100 parts by weight of the epoxy resin of a catalyst mixture for the epoxy resin comprising dicyandiamide and a diaminotriazine-modified imidazole compound in a weight ratio of the former to the latter 16/1 to 5/1,
(f) 0.1 to 10 parts by weight of an agent for preventing back side undesirable curing,
(g) 0.5 to 10 parts by weight of an anti-foaming agent,
(h) 20 to 100 parts by weight of a filler, and
(i) 55 to 100 parts by weight of a solvent.

The present invention also provides a process for producing a printed circuit board using the resin composition for forming a solder resist, and a printed circuit board thus produced.

BRIEF DESCRIPTION OF THE DRAWINGS

FIG. 3 is a graph showing a preferable mixing ratio of dicyandiamide and a diaminotriazine-modified imidazole compound as a catalyst mixture for an epoxy resin.

DESCRIPTION OF THE PREFERRED EMBODIMENTS

Figure 1A:
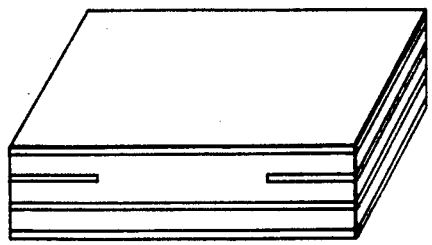
FIGS. 1(a) to 1(e) are perspective views for explaining steps for producing a printed circuit board by a partly additive process.

The photocurable diallyl phthalate resin composition for forming a solder resist comprises
(a) 100 parts by weight of a prepolymer of diallyl phthalate,
(b) 4 to 30 parts by weight of a polyfunctional unsaturated compound,
(c) 0.5 to 12 parts by weight of a photopolymerization initiator,
(d) 3 to 35 parts by weight of an epoxy resin,
(e) 2 to 20 parts by weight per 100 parts by weight of the epoxy resin of a catalyst mixture for the epoxy resin comprising dicyandiamide and a diaminetiazine-modified imidazole compound in a weight ratio of the former to the latter 16/1 to 5/1,
(f) 0.1 to 10 parts by weight of an agent for preventing back side undesirable curing,
(g) 0.5 to 10 parts by weight of an anti-foaming agent,
(h) 20 to 100 parts by weight, preferably 30 to 80 parts by weight, of a filler, and
(i) 55 to 100 parts by weight of an organic solvent for dissolving the diallyl phthalate prepolymer and the epoxy resin.

As the prepolymer of diallyl phthalate (a), there can be used a so-called β-polymer, which can be produced, for example, by the process described in Naoki Yoshimi: "Diallyl Phthalate Resins", published by Nikkan Kogyo Shinbun-sha, (1969). The prepolymer has a molecular weight of preferably 3,000 to 30,000. When the molecular weight is too small, the resulting solder resist becomes lower in resistance to adhesion to a negative mask when exposed to light, whereas when the molecular weight is too large, the resulting solder resist is poor in developing properties. The diallyl phthalate prepolymer is available commercially in the trade names of Daiso-dap A (molecular weight: 10,000), Isodap (molecular weight: 8,000), Daisodap L (molecular weight: 3500), mfd. by Daiso K. K.

The prepolymer of diallyl phthalate may contain small amounts of a diallyl phthalate monomer retained in the synthesis of the prepolymer and a three-dimensionally cross-linked γ-polymer.

As the polyfunctional unsaturated compound (b), there can be used compounds having two or more ethylene linkages in the molecule. Such compounds can be obtained by an esterification reaction of an unsaturated carboxylic acid with a di- or higher polyhydroxy compound.

Examples of the unsaturated carboxylic acid are acrylic acid, methacrylic acid, itaconic acid, crotonic acid, maleic acid, etc.

Examples of the di- or higher polyhydroxy compound are ethylene glycol, diethylene glycol, propylene glycol, triethylene glycol, hydroquinone, pyrogallol, polyethylene glycol, 1,5-pentanediol, 1,6-hexanediol, pentaerythritol, 1,3-butanediol, etc.

Examples of the polyfunctional unsaturated compounds (b) obtained by esterification using these compounds are diacrylate compounds and dimethacrylate compounds such as diethylene glycol diacrylate, polyethylene glycol diacrylate, 1,5-pentanediol diacrylate, 1,6-hexanediol diacrylate, trimethylolpropane triacrylate, pentaerythritol triacrylate, diethylene glycol dimethacrylate, trimethylolpropane trimethacrylate, 1,3-butanediol dimethacrylate, etc.; polyvalent acrylate compounds and polyvalent methacrylate compounds such as tri-, tetra-, and penta-acrylates or methacrylates of dipentaerythritol, tri-, tetra-, penta- and hexa-acrylates or methacrylates of sorbitol, etc.; oligomer ester acrylates, oligomer ester methacrylates; epoxy acrylates and epoxy methacrylates obtained by reacting an epoxy resin with acrylic acid or methacrylic acid; etc.

These polyfunctional unsaturated compounds can be used singly or as a mixture thereof in an amount of 4 to 30 parts by weight per 100 parts by weight of the diallyl phthalate prepolymer, or together with one or more monofunctional unsaturated compounds conventionally used.

As the photopolymerization initiator (c), there can be used conventionally used ones such as acetophenone and derivatives thereof, benzophenone and derivatives thereof, Michler's ketone, benzil and derivatives thereof, benzoin and derivatives thereof, thioxanthone and derivatives thereof, anthraquinone and derivatives thereof, 1-hydroxycyclohexylphenyl ketone, α-amino ketone compounds e.g., 2-methyl-1-[4-(methylthio)-phenyl]-2-morpholino-1-propane-1, etc.

These photopolymerization initiators can be used singly or as a mixture thereof in an amount of 0.5 to 12 parts by weight per 100 parts by weight of the diallyl phthalate prepolymer.

It is possible to co-use one or more amine compounds so as to enhance the action of the photopolymerization initiator.

As the epoxy resin (d), there can be used epoxy resins having two or more epoxy groups per molecule in average. Preferable examples of the epoxy resins are bisphenol type polyglycidyl ethers obtained by reacting a biphenol such as bisphenol A, bisphenol F, halogenated bisphenol A with epichlorohydrin in the presence of a basic catalyst; epoxy novolak resins and epoxy cresol resins obtained by reacting a novolak type or cresol type phenolic resin with epichlorohydrin, etc.

These epoxy resins are available commercially in trade names of Epikote 828, Epikote 152, (mfd. by Yuka Shell Epoxy K. K.), etc.

The epoxy resin is used in an amount of 3 to 35 parts by weight per 100 parts by weight of the diallyl phthalate prepolymer.

As the catalyst mixture (e) for epoxy resin, there should be used a mixture of dicyandiamide and a diaminotriazine-modified imidazole compound.

The diaminotiazine-modified imidazole compound can be represented by the formula:

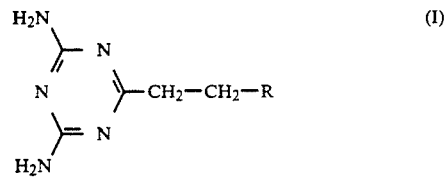

wherein R is an imidazole compound moiety.

Examples of the compound of the formula (I) are 2,4-diamino-6{2'-methylimidazole-(1')}ethyl-s-triazine, 2,4-diamino-6{2'-ethyl-4'-methylimidazole-(1')}ethyl-s-triazine, 2,4-diamino-6{2'-undecylimidazole-(1')}ethyl-s-triazine, 2,4-diamino-6{2'-methylimidazole-(1')}ethyl-s-triazine isocyanuric acid adduct, 2,4-diamino-6{2'-phenylimidazole-(1')}ethyl-5-triazine, etc.

The catalyst mixture for epoxy resin is used in an amount of 2 to 20 parts by weight per 100 parts by weight of the epoxy resin.

Further, the catalyst mixture should contain dicyandiamide and the compound of the formula (I) in a weight ratio of the former to the latter 16/1 to 5/1, more concretely, in a range enclosed by the lines A-B-C-D shown in FIG. 3, wherein points A, B, C and D have the following values:

A: 16.66 (x axis), 3.34 (y axis)
B: 19.00 (x axis), 1.19 (y axis)
C: 2.00 (x axis), 0.125 (y axis)
D: 1.67 (x axis), 0.33 (y axis)

As the agent for preventing back side undesirable curing (f), there can be used compounds which cause light absorption in the wavelength of 300 nm or more and do not pertain to a photo curing reaction.

Examples of such compounds are those decreasing an absdrptivity coefficient by exposure to ultraviolet o light such as 4-t-butyl-4'-methoxydibenzoylmethane, 2-ethylhexyl p-methoxycinnamate, 2-(2'-hydroxy-3',5'-di-tert-butylphenyl)benzotriazole, 2-(2'-hydroxy-3'-tert-1-butyl-5'-methylphenyl)-5-chlorobenzotriazole, 2-(2'-hydroxy-3',5'-tert-butylphenyl)-5-chlorobenzotriazole, 2-{2'-hydroxy-3'-(3",4",5",6"-tetrahydrophthalimidomethyl)-5'-methylphenyl}benzotriazo etc.

It is also possible to use heat resistant pigments such as phthalocyanine green, phthalocyanine blue, etc., as the agent for preventing back side undesirable curing.

The agent for preventing back side undesirable curing is used in an amount of 0.1 to 10 parts by weight per 100 parts by weight of the diallyl phthalate prepolymer. It is preferable to use the agent in an amount to make the amount of ultraviolet light transmitting the solder resist film 0.01 J/cm$^2$ or less.

The agent for preventing back side undesirable curing can not only prevent a back side of a substrate coated with a solder resist from undesirable curing of the solder resist on the back side by UV light from an opposite side when both sides of the substrate are exposed to UV light simultaneously, but also prevent halation so as to enhance the degree of resolution.

As the anti-foaming agent (g), there can be used mainly organosilicon compounds having a siloxane linkage such as a silicone oil, etc.

The anti-foaming agent is used in an amount of 0.5 to 10 parts by weight per 100 parts by weight of the diallyl phthalate prepolymer.

As the filler (h), there can be used very fine quartz powder having a particle size of 10 μm or less. Such a quartz powder is available commercially in the trade name of, for example, Crystalite 5X (particle size: 1 μm)(mfd. by Tatsumori K. K.).

The filler is used in an amount of 20 to 100 parts by weight, preferably 30 to 80 parts by weight. When the amount is outside the above-mentioned range, the effects of the present invention cannot be obtained.

That is, by the use of an unexpected large amount of filler, the effects of the present invention can be improved remarkably in, for example, mechanical properties and heat resistance of photo cured film, these properties being in general low in the case of photo cured films of photocurable resins. Generally speaking, the presence of a filler inhibits transmittance of ultraviolet light through a photo curable resin and also inhibits photo curing. But in the present invention, since the very fine quartz powder is used as a filler, it does not inhibit the transmittance of ultraviolet light. Further, since the quartz powder scatters the ultraviolet light on the surface thereof, the photo curing reaction is not inhibited. In the present invention, by the use of a large amount of the filler, not only the mechanical properties and heat resistance are improved remarkably, but also the prevention of back side undesirable curing, resistance to release from a resist and resistance to peeling of a resist are also improved, these properties relating to the photo curing properties.

As the solvent (i), there can be used organic solvents having high boiling points and being able to dissolve the diallyl phthalate prepolymer and the epoxy resin. Examples of the organic solvents are methyl Cellosolve, ethyl Cellosolve, butyl Cellosolve, methyl Cellosolve acetate, ethyl Cellosolve acetate, butyl Cellosolve acetate, methyl Cabitol, ethyl Carbitol, butyl Carbitol, terpineol, etc.

The photo curable diallyl phthalate resin composition may further contain one or more colorants, thixotropic agents such as ultrafine powder of silica (e.g. AEROSIL, mfd. by Degussa), etc.

The diallyl phthalate resin composition of the present invention shows the following effects.

(i) The diallyl phthalate resin composition can be cured by exposing to ultraviolet light. In the course of the production of printed circuit boards, cross-linking reaction takes place by exposing to ultra-violet light of 300 to 400 nm so as to cure only the exposed portions. The curing can be carried out with the dosage of 0.02 to 10 J/cm$^2$, which values are practically usable.

(ii) The diallyl phthalate resin composition shows a proper difference in solubilities in a developing solution between cured portions by exposure to ultraviolet light and uncured portions so as to give good developing properties, in other words, good degree of resolution after development.

(iii) The diallyl phthalate resin composition can be coated on both sides of a substrate for printed circuit board and normally exposed to ultraviolet light on both sides at the same time. There takes place no so-called "back side undesirable curing" wherein an ultraviolet light from one side transmits through a resist layer and a substrate and reaches a resist layer of the opposite side to cure undesirably the opposite side resist layer. Thus, differences of negative mask patterns clearly appear on both sides of the substrate without influencing the other sides mutually.

(iv) The diallyl phthalate resin composition can be subjected to exposure to ultraviolet light by attaching negative masks thereon in order to enhance the degree of resolution without adhering to the negative masks after exposure. That is, the resist layers obtained from the resin composition of the present invention do not adhere to the negative masks even if the resist layers are softened by temperature rise during the exposure to ultraviolet light. Thus, it is not necessary to clean the negative masks after exposure to light.

(v) The diallyl phthalate resin composition has good coating properties. Thus, the resin composition can be coated on the whole surfaces of a substrate by a screen pinting method, a roll coater method, or the like with uniform thickness without causing voids and without changing these properties during the coating.

(vi) The diallyl phthalate resin composition can form a solder reist having good heat resistance bearable to repeated soldering treatments. That is, even if repeating about 10 times dipping in molten solder heated at 260° C. for 10 seconds, or even if subjected to soldering with hot air, infrared rays, vapor, etc., corresponding to such repeated soldering treatments, there take place no abnormalities such as blisters, peeling, etc. on a resist formed on a printed circuit board substrate.

(vii) The diallyl phthalate resin composition can form a solder resist having good electrical insulating properties without causing insulating deterioration between individual wirings, and being able to maintain good electrical insulating properties even under high humidity.

(viii) The dially phthalate resin composition can form a solder resist having good chemical resistance without being dissolved or denatured by solvents used for fluxing, washing, soldering and the like at the time of mounting of parts on a printed circuit board.

(ix) The diallyl phthalate resin composition can form a solder resist having good alkali resistance and good resistance to peeling of a resist from a copper foil coated thereunder (i.e., so-called resistance to cathode peeling). More concretely, the solder resist is not dissolved nor denatured even if dipped in an electroless copper plating bath with high temperatures, high alkalinity and depositing voltage of $-0.6$ to $-0.9$ V for a long period of time, and there takes place no peeling of the solder resist from the substrate and conductor circuits. More concretely, peeling or dederioration of adhesive strength does not take place between circuit copper foils and the solder resist.

Such a phenomenon of peeling takes place in the portion where a conductor circuit is completely covered with the solder resist and the depositing voltage ($-0.6$ to $-0.9$ V) is applied. Thus, water seems to reach an interface of the circuit copper foil through the resist film during plating to reduce copper oxide on the surface of the circuit copper foil by the depositing voltage, resulting in peeling of the resist film due to breaking of bonding to the resist film. Thus, the prevention of such a phenomenon, that is, the resistance to peeling of a resist (the resistance to cathode peeling) is distinguished from the resistance to plating conventionally used in the art. In order to prevent such a phenomenon, it is important to prevent the formation of copper oxide on the circuit copper foil during the production of printed circuit board. According to the present invention, the resistance to peeling of a resist can be enhanced remarkably.

This is particularly important in the production of printed circuit boards by the partly additive process.

(x) The diallyl phthalate resin composition can form a solder resist having good resistance to release of substances from a resist film for deteriorating properties of plated film (i.e. resistance to release from a resist).

The diallyl phthalate resin composition of the present invention is particularly suitable for forming a solder resist in the partly additive process. Needless to say, the resin composition of the present invention can be used not only in the subtractive process but also in the full additive process.

The subtractive process is schematically shown in FIGS. 2(a) to 2(e) using a four layered board. The subtactive process comprises forming inner layers, laminating copper foils on both sides of a laminate to give a copper-clad laminate (FIG. 2(a)), drilling through-holes on predetermined positions and seeding a catalyst (FIG. 2(b)), conducting electric copper plating on whole surfaces of the laminate including the throughholes (FIG. 2(c)), forming predetermined circuit patterns by etching and coating a solder resist thereon (FIG. 2(d)). The solder resist is formed by a screen printing method usually using a thermosetting epoxy resin (FIG. 2(e)). But with an increase of wiring density of printed circuit boards, UV exposure developing type solder resists have been developed, but still not sufficient.

According to the partly additive process, after drilling through-holes on predetermined positions on a copper-clad laminate and seeding a catalyst; conductor circuits are formed first, different from the subtractive process. Then, plating resistant reactive solder resists are formed on predetermined positions, followed by electroless copper plating on only necessary portions such as through-holes, land portions, etc.

The partly additive process has advantages in lower cost and higher precision than the subtractive process. Further, according to the partly additive process, since only necessary portions are partly plated and only thin copper foil portions of the copper-clad laminate are subjected to etching for forming conductor circuits, the step is simple and loss is a little to make high precision wiring possible. In the partly additive process, since the resist is further used as a permanent resist after subjected to severe steps of applying a depositing voltage of $-0.6$ to $-0.9$ V for electroless copper plating to wiring pattern under the plating resistant solder resist, and dipping in a plating bath at high temperatures with high pH for a long period of time, it is necessary to have functions as a solder resist.

According to the present invention, a printed circuit board can be produced by drilling through-holes in a copper-clad laminate, followed by seeding a catalyst for electroless copper plating on inner walls of the through-holes, forming a conductor circuit on an insulating substrate by an etching method, conducting thin electroless copper plating on conductor circuits and through-hole portions depending on necessity, coating the photo curable diallyl phthalate resin composition on the whole surfaces of the substrate, drying the photo curable diallyl phthalate resin composition and exposing portions except for inner walls of through-holes requiring electroless copper plating, land portions around the through-holes, connector portions and IC connecting portions to ultraviolet light to form a solder resist, developing with a solvent to remove uncured diallyl phthalate resin composition for forming a pattern, curing the solder resist with heating, and if necessary, exposing to ultraviolet light again, and carrying out electroless copper plating.

The process is explained in detail referring to FIGS. 1(a) to 1(e).

Figure 1B:
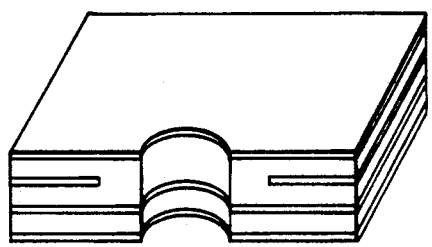
Figure 1C:
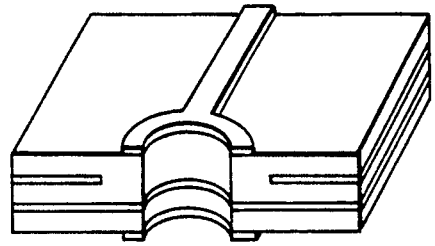

A copper-clad laminate (FIG. 1(a)) is drilled to form through-holes and a catalyst for electroless copper plating is seeded (FIG. 1(b)). A pattern is formed by forming conductor circuits on both sides of the substrate by a conventional etching method (FIG. 1(c)).

Then, the photo curable diallyl phthalate resin composition is coated on whole surfaces of the substrate including the conductor circuits, followed by drying to solidify the resist. The same step is repeated on the rear side. Alternatively, the photo curable diallyl phthalate resin composition is coated on both sides of the substrate simultaneously, followed by drying to form solidified resist layers on both sides of the substrate. It is preferable to dry at a temperature of 60° to 100° C. for 0.2 to 2 hours.

Then, the resist layers on both sides are tightly covered with negative masks and exposed to ultraviolet light simultaneously. The dosage on one side is preferably 0.1 to 1 J/cm$^2$. Further, even if both sides are exposed to ultraviolet light under such conditions, incident ultraviolet light from one side does not cure the resist layer on the opposite side. This is a surprising thing considering the resin composition disclosed in Japanese Patent Unexamined Publication No. 62-265321.

Then, the negative masks are removed from the resist layers, followed by developing of unexposed portions. As a developing solution, it is possible to use a chlorine-containing solvent such as 1,1,1-trichloroethane, which is non-inflammable. The developing time is usually 0.5 to 5 minutes.

Then, the substrate is heated at 140° to 180° C. for 0.2 to 2 hours to cure the pattern formed resist portions.

The resists on the substrate are further exposed to ultraviolet light to complete the curing of the resists. The dosage for post curing is preferably 1 to 10 J/cm$^2$.

Figure 1D:
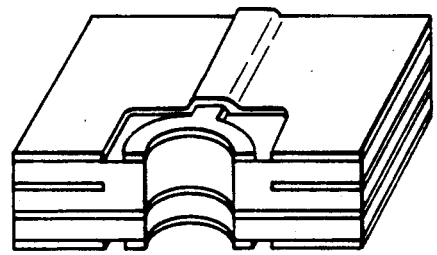
Figure 1E:
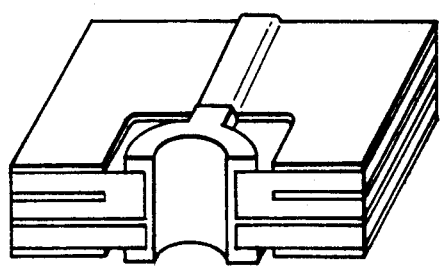
Figure 2A:
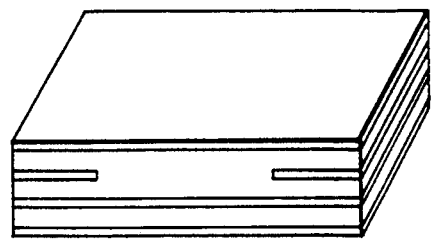
FIGS. 2(a) to 2(e) are perspective views for explaining steps for producing a printed circuit board by a subtractive process.
Figure 2B:
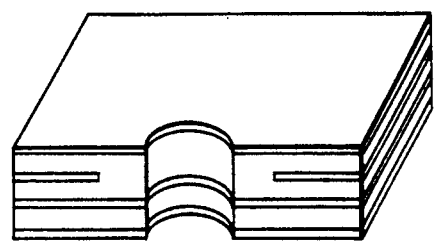
Figure 2C:
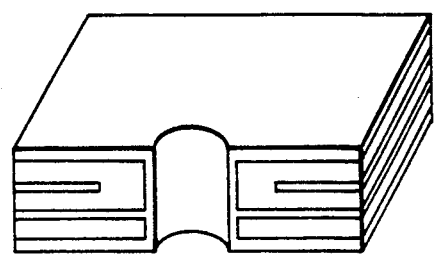
Figure 2D:
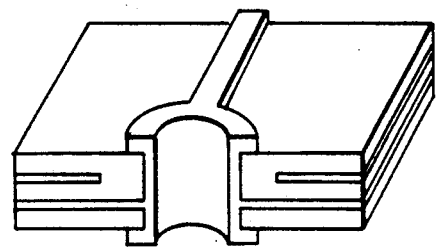
Figure 2E:
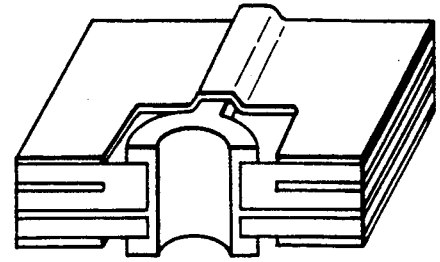

Thus, the resist layers are formed on the substrate (FIG. 1(d)).

The substrate is then dipped in an electroless copper bath to conduct electroless plating on only the inner walls of through-holes, the land portions and other major portions to form thick plated copper layers. Thus, a printed circuit board is produced by the partly additive process (FIG. 1(e)).

According to the present invention, no peeling of the resist layers on circuit copper foils takes place during such an electroless copper plating step. This is also a very surprising advantage of the present invention.

As mentioned above, high density printed circuit boards can be produced by the partly additive process according to the present invention.

The present invention is illsutrated by way of the following Examples, in which all parts and percents are by weight, unless otherwise specified.

EXAMPLES 1 to 45

Using diallyl phthalate resin compositions listed in Tables 1 to 5, printed circuit boards were produced by the partly additive process as shown in FIGS. 1(a) to 1(e).

A double-sided copper-clad glass epoxy laminate (substrate) having copper foils of 35 μm thereon was drilled to form through-holes, followed by seeding of a catalyst for plating nucleus by a conventional method FIG. 1(b)]. Conductor circuits were formed on both sides of the substrate by etching on predetermined portions of the copper foils [FIG. 1(c)].

Then, a photo curable diallyl phthalate resin composition as listed in Tables 1 to 5 was coated on the whole surfaces of the substrate including the conductor circuits.

For example, the resin composition of Example 1 comprises as follows.

(a) dially phthalate prepolymer (Isodap, mfd. by Daiso K. K., average molecular weight 7000) —100 g (b) trimethylolpropane trimethacrylate—20 g (d) Epikote 828 (a trade name of bisphenol A type epoxy resin, mfd. by Yuka Shell Epoxy K. K.)—15 g (c-1) 2-methyl-1-[4-(methyl)phenyl]-2-morpholino-1-propane —14 g (c-2) 4,4'-bis(diethylamino)benzophenone—0.5 g (e-1) dicyandiamide—1.5 g (e-2) 2,4-diamino-6[2'-methylimidazole-(1')]-ethyl-s-triazine —0.18 g (f) phthalocyanine green—0.5 g (g) Silicone oil SH-203 (a trade name, mfd. by Toray Silicone K. K.)—5 g (i) ethyl Cellosolve acetate—35 g butyl Cellosolve acetate—30 g (j) a thixotopic agent (Aerosil A380, a trade name of fine powder of silica, mdf. by Japan Aerosil, K. K.)—3 g (h) a filler (Crystalite 5X, a trade name, mfd. by Tatsumori K. K.)—50 g In a separable flask, ingredients (a), (b), (d), (c-1) and (i) were placed and mixed for dissolving with heating at 80° to 100° C. for 30 minutes to 2 hours. After cooling the mixture to room temperature, ingredients (e-1), (e-2), (f), (g), (j) and (h) were added with well stirring. The resulting mixture was kneaded using a three-roll mill. Then, the viscosity was adjusted using the organic solvents (i) so as to be suitable for screen printing, roll coater coating or the like.

The resist coated substrate was dried at 80° C. for 30 minutes to solidify the resist. On the back side, the same step was repeated to form a resist solidified layer. The resist layers on the both sides were covered with negative masks and exposed to ultraviolet light from both sides simutlaneously at the dosage of 1 J/cm².

After removing the negative masks, unexposed portions were removed by spray developing at room temperature for 1 minute using as a developing solution, 1,1,1-trichloroethane.

Then, the substrate was heated at 150° C. for 40 minutes to cure the pattern formed resist portions. The resists on the substrate were subjected to post exposure to ultraviolet light at the dosage of 5 J/cm² to complete the curing of the resists [FIG. 1(d)].

Then, the substrate was dipped in the following electroless copper bath (mfd. by Shipley Corp.) for minutes to form a thin electroless copper plated film of about 0.4 μm.

Copper mix 328 A—125 ml
Copper mix 328 L—125 ml
Copper mix 328 C.—25 ml
Distilled water—making the total amount 1 liter Then, the substrate was dipped in the following electroless copper plating bath for 15 hours to form electroless copper plated film of about 30 μm on the necessary portions such as inner walls of through-holes, the land portions, terminal portions, and the like. Thus, a printed circuit board was produced [FIG. 1(e)].

| | |
|---|---|
| $CuSO_4.5H_2O$ | 12 g |
| EDTA.2Na | 42 g |
| NaOH (for making pH of the plating bath 12.3) | |
| Amine series surfactant | 0.1 g |
| $\alpha,\alpha'$-dipyridyl | 0.05 g |
| 37% formalin | 5 ml |
| $K_2S$ | 0.001 g |
| Distilled water | making the total amount 1 liter |
| [Plating conditions] | |
| bath temperature | 70° C. |
| pH | 12.5 |
| time | 15 hours |
| depositing voltage | −0.6 to −0.9 V |

The plating bath composition in a plating tank was maintained constant by attaching an automatic controlling apparatus and a bath regenerating apparatus for removing by-products.

In the above-mentioned process, the step of thin copper plating is conducted after the formation of the resist film, but it can be conducted before the formation of the resist film. Further, it is effective to prevent the ultraviolet light from reaching inside of the through-holes transmitting through the glass epoxy substrate.

The following properties for producing, or after producing the printed circuit boards were tested and shown in Tables 1 to 5.

(1) Coating properties

Coating properties for giving a smooth resist film without retaining voids was evaluated as "good".

(2) Resistance to adhesion to negative mask

A resist film was closely covered with a negative mask and exposed to ultraviolet light. After the exposure to UV light, no adhesion of the resist film to the negative mask was evaluated as "good".

(3) Developing properties

A resist film was spray developed using 1,1,1-trichloroethane as a developing solution at room temperature for 1 minute. When non-exposed portions were completely dissolved and the resist of exposed portions was not swelled, the developing properties were evaluated as "good".

(4) Prevention of back side undesirable curing

A resin composition was coated on both sides of a glass epoxy laminate of 1.6 mm thick to form resist films of about 40 μm after dried. The resist films were closely covered with negative masks and exposed to ultraviolet light from one side at the dosage of 1 J/cm², followed by development. When the resist film on the opposite side was not cured and no resist was retained, this was evaluated as "good".

(5) Resistance to release from resist:

When film properties (e.g. tensile strength, elongation) of electroless copper plated film was not lowered due to substances to be released from a resist film, this was evaluated as "good". This was evalauted by placing a resist film of 400 cm² in 1 liter of electroless copper plating bath.

(6) Resistance to peeling of resist (resistance to cathode peeling)

A resist film formed on a conductor pattern connected to electroless copper plated through-holes, land portions, terminals, etc. was copper plated electrolessly. When no peeling and discoloring of the resist film was observed, this was evaluated as "good".

(7) Electrical insulating properties

Comb-like patterns were formed on a copper clad glass epoxy laminate according to JIS C-2519. Resist films were formed thereon, followed by electroless copper plating. When electrical insulating resistance under moisture absorption was $10^9 \Omega$ or more, this was evaluated as "good".

(8) Heat resistance

A flux was coated on a printed circuit board produced by a process as mentioned above. The resulting printed circuit board was dipped in a solder bath heated at 260° C. for 10 seconds and cooled to room temperature. After repeating this 10 times, a resist having no abnormalities such as blisters, peeling, etc. was evaluated as "good".

EXAMPLE 46

Using the photo curable diallyl phthalate resin composition as used in Example 1 for forming a solder resist, influences of various conditions for producing printed circuit boards on various properties were examined. The conditions not particularly specified were the same as those in Example 1.

The results were as follows.

Since the resin composition was in a liquid state, it was necessary to dry the resulting resist film coated on a substrate so as to closely cover the resist film with a negative mask. The most suitable drying conditions were heating at 60° to 100° C. and for 0.2 to 2 hours. When the drying was carried out at 50° C. for 2 hours, the solvent was retained so as to make the close light exposure impossible. On the other hand, when the drying was carried out at 110° C. for 2 hours, thermal curing of the epoxy resin proceeded too much, so that patterns were not formed by developing.

The thermal curing step was the most important, since it related to curing of the epoxy resin and resistance to lowering plating properties was influenced by the curing of the epoxy resin. The most suitable curing conditions were heating at 140° to 180° C. for 0.2 to 2 hours. When cured at 130° C. for 2 hours, the resistance to release from a resist was lowered due to incomplete curing of the epoxy resin. On the other hand, when cured at 190° C., since the circuit copper foil was oxidized, the resistance to peeling of a resist was lowered to make practical use impossible.

The exposure to ultraviolet light was effective for enhancing the heat resistance. The most suitable dosage was 1 to 10 J/cm².

When printed circuit boards obtained by using the diallyl phthalate resin compositions of Examples 1 to 45 under the most suitable conditions were subjected to the cooling and heating cycle test according to JIS C-5012 100 times. As a result, no abnormalities such as blisters and peeling of the resist layers nor cracks nor blisters on through-hole portions were produced.

COMPARATIVE EXAMPLES 1 to 22

Printed circuit boards were produced in the same manner as described in Example 1 except for using the photo curable diallyl phthalate resin compositions as listed in Tables 6 and 7. Various properties were tested and listed in Tables 6 and 7.

As shown in Tables 6 and 7, the resulting printed circuit boards were not able to be used practically since the coating properties, the resistance to adhesion to a negative mask, the developing properties, the prevention of back side undesirable curing, the resistance to release from a resist, the resistance to peeling of a resist (resistance to cathode peeling), the electrical insulating properties and the heat resistance were not satisfied at the same time.

TABLE 1

| Example No. | 1 | 2 | 3 | 4 | 5 | 6 | 7 | 8 | 9 | 10 |
|---|---|---|---|---|---|---|---|---|---|---|
| Daisodap A | — | 100 | — | — | — | — | — | 100 | 100 | 100 |
| Isodap | 100 | — | — | 100 | 100 | 100 | 100 | — | — | — |
| Daisodap L | — | — | 100 | — | — | — | — | — | — | — |
| 1,3-Butylene glycol diacrylate | — | — | — | 30 | — | — | — | — | — | — |
| Diethylene glycol diacrylate | — | — | — | — | 30 | — | — | — | — | — |
| Trimethylolpropane trimethacrylate | 20 | 20 | 20 | — | — | — | — | — | — | — |
| Ditrimethylolpropane tetracrylate | — | — | — | — | — | 15 | — | 4 | 30 | — |
| Dipentaerythritol monohydroxypentaacrylate | — | — | — | — | — | — | 10 | — | — | 4 |
| Epikote 828 | 15 | 15 | 15 | 15 | 15 | 15 | 15 | 15 | 15 | 15 |
| 4,4'-Bis(N,N'-diethylamino)-benzophenone | 0.5 | 0.5 | 0.5 | 0.5 | 0.5 | 0.5 | 0.5 | 0.5 | 0.5 | 0.5 |
| 2-Methyl-1-[4-(methylthio)-phenyl]-2-morpholino-1-propane-1 | 4 | 4 | 4 | 4 | 4 | 4 | 4 | 4 | 4 | 4 |
| Dicyandiamide | 1.5 | 1.5 | 1.5 | 1.5 | 1.5 | 1.5 | 1.5 | 1.5 | 1.5 | 1.5 |
| 2,4-Diamino-6[2'-methylimidazole-(1')]-ethyl-s-triazine | 0.18 | 0.18 | 0.18 | 0.18 | 0.18 | 0.18 | 0.18 | 0.18 | 0.18 | 0.15 |
| Phthalocyanine green | 0.5 | 0.5 | 0.5 | 0.5 | 0.5 | 0.5 | 0.5 | 0.5 | 0.5 | 0.5 |
| 4-t-Butyl-4'-methoxy-dibenzyl-methane | — | — | — | 0.5 | 0.5 | — | — | — | 3 | — |
| 2-Ethylhexyl-p-methoxycinnamate | — | — | — | 0.5 | 0.5 | — | — | — | 3 | — |
| Silicone oil SH-203 | 5 | 5 | 5 | 5 | 5 | 5 | 5 | 5 | 5 | 5 |
| Aerosil A380 | 3 | 3 | 3 | 3 | 3 | 3 | 3 | 3 | 3 | 3 |
| Crystalite 5X | 50 | 50 | 50 | 50 | 50 | 50 | 50 | 50 | 50 | 50 |
| Ethyl Cellosolve acetate | 35 | 35 | 30 | 30 | 30 | 35 | 35 | 40 | 40 | 40 |

TABLE 1-continued

| Example No. | | 1 | 2 | 3 | 4 | 5 | 6 | 7 | 8 | 9 | 10 |
|---|---|---|---|---|---|---|---|---|---|---|---|
| Butyl Cellosolve acetate | | 30 | 35 | 30 | 30 | 30 | 30 | 35 | 38 | 35 | 35 |
| Properties[*1] | (1) | G[*2] | G | G | G | G | G | G | G | G | G |
| | (2) | G | G | G | G | G | G | G | G | G | G |
| | (3) | G | G | G | G | G | G | G | G | G | G |
| | (4) | G | G | G | G | G | G | G | G | G | G |
| | (5) | 7.5 | 8.0 | 7.5 | 6.4 | 7.2 | 6.3 | 6.5 | 7.2 | 7.3 | 6.5 |
| | (6) | G | G | G | G | G | G | G | G | G | G |
| | (7) | G | G | G | G | G | G | G | G | G | G |
| | (8) | G | G | G | G | G | G | G | G | G | G |

[*1] (1) Coating properties
(2) Resistance to adhesion to negative mask
(3) Developing properties
(4) Prevention of back side undesirable curing
(5) Resistance to release from resist
(6) Resistance to peeling of resist
(7) Electrical insulating properties
(8) Heat resistance
[*2] G: good

TABLE 2

| Example No. | | 11 | 12 | 13 | 14 | 15 | 16 | 17 | 18 | 19 | 20 |
|---|---|---|---|---|---|---|---|---|---|---|---|
| Daisodap A | | 100 | — | — | — | — | — | — | — | — | — |
| Daisodap L | | — | 100 | 100 | 100 | 100 | 100 | 100 | 100 | 100 | 100 |
| Trimethylolpropane triacrylate | | — | 20 | 20 | 20 | 20 | 20 | 20 | 20 | 20 | 20 |
| Dipentaerythritol monohydroxypentacrylate | | 30 | — | — | — | — | — | — | — | — | — |
| Epikote 828 | | 15 | 15 | 15 | 15 | 15 | 15 | 15 | — | — | — |
| Epikote 152 | | — | — | — | — | — | — | — | 5 | 15 | 35 |
| Benzophenone | | — | 4 | — | — | — | 6 | 0.3 | — | — | — |
| 4,4'-Bis(N,N'-diethylamino)benzophenone | | 0.5 | 0.5 | 3 | 0.1 | 2 | 6 | 0.2 | 0.5 | 0.5 | 0.5 |
| 2-Methyl-1-[4-(methylthio)phenyl]-2-morpholino-1-propane-1 | | 4 | — | — | 0.4 | 10 | — | — | 4 | 4 | 4 |
| Acetophenone | | — | — | 3 | — | — | — | — | — | — | — |
| Dicyandiamide | | 1.5 | 1.5 | 1.5 | 1.5 | 1.5 | 1.5 | 1.5 | 0.5 | 1.5 | 3.5 |
| 2,4-Diamino-6[2'-methylimidazole-(1')]-ethyl-s-triazine | | 0.15 | 0.15 | 0.15 | 0.15 | 0.15 | 0.15 | 0.15 | 0.05 | 0.15 | 0.3 |
| Phthalocyanine green | | 0.5 | 0.5 | 0.5 | 0.5 | 0.5 | 0.5 | 0.5 | 0.5 | 0.5 | 0.5 |
| 4-t-Butyl-4'-methoxy-dibenzylmethane | | 5 | — | — | — | — | — | — | — | — | — |
| 2-Ethylhexyl p-methoxycinnamate | | 4.5 | — | — | — | — | — | — | — | — | — |
| Silicone oil SH-203 | | 5 | 5 | 5 | 5 | 5 | 5 | 5 | 5 | 5 | 5 |
| Aerosil A380 | | 3 | 3 | 3 | 3 | 3 | 3 | 3 | 3 | 3 | 3 |
| Crystalite 5X | | 50 | 50 | 50 | 50 | 50 | 50 | 50 | 50 | 50 | 50 |
| Ethyl Cellosolve acetate | | 35 | 30 | 30 | 30 | 30 | 30 | 30 | 30 | 30 | 30 |
| Butyl Cellosolve acetate | | 30 | 30 | 30 | 30 | 30 | 30 | 30 | 30 | 30 | 30 |
| Properties | (1) | G | G | G | G | G | G | G | G | G | G |
| | (2) | G | G | G | G | G | G | G | G | G | G |
| | (3) | G | G | G | G | G | G | G | G | G | G |
| | (4) | G | G | G | G | G | G | G | G | G | G |
| | (5) | 6.8 | 5.8 | 7.5 | 3.8 | 7.4 | 6.5 | 6.6 | 7.8 | 7.7 | 6.8 |
| | (6) | G | G | G | G | G | G | G | G | G | G |
| | (7) | G | G | G | G | G | G | G | G | G | G |
| | (8) | G | G | G | G | G | G | G | G | G | G |

TABLE 3

| Example No. | 21 | 22 | 23 | 24 | 25 | 26 | 27 | 28 | 29 | 30 |
|---|---|---|---|---|---|---|---|---|---|---|
| Daisodap A | — | — | 100 | 100 | 100 | 100 | 100 | 100 | 100 | — |
| Isodap | — | — | — | — | — | — | — | — | — | 50 |
| Daisodap L | 100 | 100 | — | — | — | — | — | — | — | 50 |
| Trimethylolpropane trimethacrylate | 20 | 20 | — | — | — | — | — | — | — | — |
| Dipentaerythritol monohydroxypentaacrylate | — | — | 10 | 10 | 10 | 10 | 10 | 10 | 10 | 25 |
| Epikote 828 | 5 | 35 | — | — | — | — | — | — | — | — |
| Epikote 152 | — | — | 15 | 15 | 15 | 15 | 15 | 15 | 15 | 15 |
| 4,4'-Bis(N,N'-diethylamino)benzophenone | 0.5 | 0.5 | — | — | — | — | — | — | — | 0.1 |
| 2-Methyl-1-[4-(methylthio)phenyl]-2-morpholino-1-propane-1 | 4 | 4 | 3 | 3 | 3 | 3 | 3 | 3 | 3 | 4 |
| Acetophenone | — | — | 2 | 2 | 2 | 2 | 2 | 3 | 2 | — |
| Dicyandiamide | 0.5 | 3.5 | 2.5 | 0.25 | 1.5 | 1.5 | 1.5 | 1.5 | 1.5 | 1.5 |
| 2,4-Diamino-6[2'-methylimidazole-(1')]-ethyl-s-triazine | 0.05 | 0.35 | 0.5 | 0.05 | 0.30 | 0.09 | — | — | — | 0.15 |
| 2,4-Diamino-6[2'-ethyl-4'-methyl-imidazole-(1')]-ethyl-s-triazine | — | — | — | — | — | — | 0.15 | — | — | — |
| 2,4-Diamino-6[2'-undecylimidazole-(1')]-ethyl-s-triazine | — | — | — | — | — | — | — | 0.15 | — | — |
| 2,4-Diamino-6[2'-methylimidazole-(1')]- | — | — | — | — | — | — | — | — | 0.15 | — |

TABLE 3-continued

| Example No. | 21 | 22 | 23 | 24 | 25 | 26 | 27 | 28 | 29 | 30 |
|---|---|---|---|---|---|---|---|---|---|---|
| ethyl-s-triazine.isocyanuric acid adduct | | | | | | | | | | |
| Phthalocyanine green | 0.5 | 0.5 | 0.5 | 0.5 | 0.5 | 0.5 | 0.5 | 0.5 | 0.5 | 5 |
| 4-t-Butyl-4'-methoxy-dibenzoinmethane | — | — | 0.5 | 0.5 | 0.5 | 0.5 | 0.5 | 0.5 | 0.5 | — |
| 2-Ethylhexyl p-methoxycinnamate | — | — | 0.5 | 0.5 | 0.5 | 0.5 | 0.5 | 0.5 | 0.5 | — |
| Silicone oil SH-203 | 5 | 5 | 5 | 5 | 5 | 5 | 5 | 5 | 5 | 5 |
| Aerosil A380 | 3 | 3 | 3 | 3 | 3 | 3 | 3 | 3 | 3 | 3 |
| Crystalite 5X | 50 | 50 | 50 | 50 | 50 | 50 | 50 | 50 | 50 | 50 |
| Ethyl Cellosolve acetate | 30 | 30 | 35 | 35 | 35 | 35 | 35 | 35 | 35 | 35 |
| Butyl Cellosolve acetate | 30 | 30 | 35 | 35 | 35 | 35 | 35 | 35 | 35 | 30 |
| Properties (1) | G | G | G | G | G | G | G | G | G | G |
| (2) | G | G | G | G | G | G | G | G | G | G |
| (3) | G | G | G | G | G | G | G | G | G | G |
| (4) | G | G | G | G | G | G | G | G | G | G |
| (5) | 7.5 | 6.8 | 7.9 | 6.5 | 5.9 | 7.0 | 7.1 | 7.6 | 7.5 | 7.9 |
| (6) | G | G | G | G | G | G | G | G | G | G |
| (7) | G | G | G | G | G | G | G | G | G | G |
| (8) | G | G | G | G | G | G | G | G | G | G |

TABLE 4

| Example No. | 31 | 32 | 33 | 34 | 35 | 36 | 37 | 38 | 39 | 40 |
|---|---|---|---|---|---|---|---|---|---|---|
| Isodap | 50 | 50 | 50 | 50 | 50 | 50 | 50 | 50 | 100 | 100 |
| Daisodap L | 50 | 50 | 50 | 50 | 50 | 50 | 50 | 50 | — | — |
| 1,3-Butylene glycol diacrylate | 4 | — | — | — | — | — | — | — | — | — |
| Trimethylolpropane trimethacrylate | — | — | — | — | — | — | — | — | 20 | 20 |
| Ditrimethylolpropane tetraacrylate | — | 20 | 20 | 20 | 20 | 15 | 15 | 20 | — | — |
| Dipentaerythritol monohydroxy-pentaacrylate | — | 3 | 5 | 7 | 10 | 3 | 5 | 10 | — | — |
| Epikote 828 | — | — | — | — | — | — | — | — | 15 | 15 |
| Epikote 152 | 15 | 15 | 15 | 15 | 15 | 15 | 15 | 15 | — | — |
| 4,4'-Bis(N,N'-diethylamino)benzophenone | 0.1 | — | — | — | — | — | — | — | 0.5 | 0.5 |
| 2-Methyl-1-[4-(methylthio)phenyl]-2-morpholino-1-propane-1 | 4 | 4 | 3 | 3 | 3 | 3 | 3 | 3 | 4 | 4 |
| Acetophenone | — | 2 | 2 | 2 | 2 | 2 | 2 | 2 | 2 | 2 |
| Dicyandiamide | 1.5 | 1.5 | 1.5 | 1.5 | 1.5 | 1.5 | 1.5 | 1.5 | 1.5 | 1.5 |
| 2,4-Diamino-6[2'-methylimidazole-(1')]-ethyl-s-triazine | 0.15 | — | — | — | — | — | — | — | 0.15 | 0.15 |
| 2,4-Diamino-6[2'-ethyl-4'-methylimidazole-(1')]-ethyl-s-trizine | — | 0.15 | 0.15 | 0.15 | 0.15 | — | — | — | — | — |
| 2,4-Diamino-6[2'-methylimidazole-(1')]-ethyl-s-triazine.isocyanuric acid adduct | — | — | — | — | — | 0.15 | 0.05 | 0.15 | — | — |
| Phthalocyanine green | 0.1 | 0.5 | 0.5 | 0.5 | 0.5 | — | — | — | 0.5 | 0.5 |
| 4-t-Butyl-4'-methoxy-dibenzoylmethane | — | 1 | 2 | 3 | 4.5 | 1 | 2 | 5 | — | — |
| 2-Ethylhexyl p-methoxycinnamate | — | 1 | 4 | 3 | 5 | 1 | 4 | 5 | — | — |
| Silicone oil SH-203 | 5 | 5 | 5 | 5 | 5 | 5 | 5 | 5 | 0.5 | 10 |
| Aerosil A380 | 3 | 3 | 3 | 3 | 3 | 3 | 3 | 3 | 3 | 3 |
| Crystalite 5X | 50 | 50 | 50 | 50 | 50 | 50 | 50 | 50 | 50 | 50 |
| Ethyl Cellosolve acetate | 40 | 35 | 35 | 35 | 35 | 35 | 35 | 35 | 35 | 35 |
| Butyl Cellosolve acetate | 35 | 30 | 30 | 30 | 28 | 30 | 30 | 28 | 30 | 30 |
| Properties | | | | | | | | | | |
| (1) | G | G | G | G | G | G | G | G | G | G |
| (2) | G | G | G | G | G | G | G | G | G | G |
| (3) | G | G | G | G | G | G | G | G | G | G |
| (4) | G | G | G | G | G | G | G | G | G | G |
| (5) | 6.5 | 6.2 | 6.6 | 6.1 | 7.5 | 6.8 | 5.9 | 6.6 | 5.4 | 4.9 |
| (6) | G | G | G | G | G | G | G | G | G | G |
| (7) | G | G | G | G | G | G | G | G | G | G |
| (8) | G | G | G | G | G | G | G | G | G | G |

TABLE 5

| Example No. | 41 | 42 | 43 | 44 | 45 |
|---|---|---|---|---|---|
| Daisodap A | — | 100 | — | 100 | 100 |
| Isodap | 100 | — | — | — | — |
| Daisodap L | — | — | 100 | — | — |
| Diethylene glycol dimethacrylate | 30 | 30 | 30 | — | — |
| Dipentaerythritol monohydroxypentaacrylate | — | — | — | 4 | 4 |
| Epikote 828 | 15 | 15 | 15 | 15 | 8 |
| 4,4'-Bis(N,N'-diethylamino)benzophenone | 0.5 | 0.5 | 0.5 | 0.5 | 0.5 |
| 2-Methyl-1-[4-(methylthio)phenyl]-2-morpholino-1-propane-1 | 4 | 4 | 4 | 4 | 4 |
| Dicyandiamide | 1.5 | 1.5 | 1.5 | 1.5 | 0.8 |
| 2,4-Diamino-6[2'-methylimidazole-(1')]-ethyl-s-triazine | 0.18 | 0.18 | 0.18 | 0.18 | 0.08 |

TABLE 5-continued

| Example No. | 41 | 42 | 43 | 44 | 45 |
|---|---|---|---|---|---|
| Phthalocyanine green | 0.5 | 0.5 | 0.5 | 0.5 | 0.5 |
| 4-t-Butyl-4'-methoxy-dibenzoylmethane | 0.5 | 0.5 | 0.5 | — | — |
| 2-Ethylhexyl p-methoxycinnamate | 0.5 | 0.5 | 0.5 | — | — |
| Silicone oil SH-203 | 5 | 5 | 5 | 5 | 5 |
| Aerosil A380 | 3 | 3 | 3 | 3 | 3 |
| Crystalite 5X | 20 | 20 | 20 | 100 | 100 |
| Ethyl Cellosolve acetate | 30 | 35 | 45 | 50 | 60 |
| Butyl Cellosolve acetate | 25 | 25 | 15 | 50 | 40 |
| Properties | | | | | |
| (1) | G | G | G | G | G |
| (2) | G | G | G | G | G |
| (3) | G | G | G | G | G |
| (4) | G | G | G | G | G |
| (5) | 6.8 | 6.0 | 7.5 | 7.3 | 7.7 |
| (6) | G | G | G | G | G |
| (7) | G | G | G | G | G |
| (8) | G | G | G | G | G |

TABLE 6

| Comparative Example No. | 1 | 2 | 3 | 4 | 5 | 6 | 7 | 8 | 9 | 10 |
|---|---|---|---|---|---|---|---|---|---|---|
| Daisodap A | 100 | 100 | 100 | 100 | 100 | 100 | 100 | 100 | 100 | 100 |
| Trimethylalpropane trimethacrylate | 3 | 35 | 20 | 20 | 20 | 20 | 20 | 20 | 20 | 20 |
| Epikote 152 | 15 | 15 | 15 | 15 | 1 | 40 | 15 | 15 | 15 | 15 |
| 4,4'-Bis(N,N'-diethylamino)benzophenone | 0.5 | 0.5 | 0.1 | 1.5 | 0.5 | 0.5 | 0.5 | 0.5 | 0.5 | 0.5 |
| 2-Methyl-1-[4-(methylthio)phenyl]-2-morpholino-1-propane-1 | 4 | 4 | 0.2 | 12 | 4 | 4 | 4 | 4 | 4 | 4 |
| Dicyandiamide | 1.5 | 1.5 | 1.5 | 1.5 | 0.1 | 4.0 | 0.2 | 3.5 | 1.5 | 1.5 |
| 2,4-Diamino-6[2'-methylimidazole-(1')]-ethyl-s-triazine | 0.18 | 0.18 | 0.18 | 0.18 | 0.01 | 0.5 | 0.02 | 0.35 | 0.08 | 0.5 |
| Phthalocyanine green | 0.5 | 0.5 | 0.5 | 0.5 | 0.5 | 0.5 | 0.5 | 0.5 | 0.5 | 0.5 |
| 4-t-Butyl-4'-methoxy-dibenzoylmethane | — | 0.5 | — | — | — | — | — | — | — | — |
| 2-Ethylhexyl p-methoxycinnamate | — | 0.5 | — | — | — | — | — | — | — | — |
| Silicone oil SH-203 | 5 | 5 | 5 | 5 | 5 | 5 | 5 | 5 | 5 | 5 |
| Aerosil A380 | 3 | 3 | 3 | 3 | 3 | 3 | 3 | 3 | 3 | 3 |
| Crystalite 5X | 50 | 50 | 50 | 50 | 50 | 50 | 50 | 50 | 50 | 50 |
| Ethyl Cellosolve acetate | 40 | 30 | 35 | 35 | 30 | 32 | 35 | 35 | 35 | 35 |
| Butyl Cellosolve acetate | 35 | 30 | 35 | 35 | 30 | 30 | 35 | 35 | 35 | 35 |
| Properties | | | | | | | | | | |
| (1) | G | G | G | G | G | G | G | G | G | G |
| (2) | G | NG*3 | G | G | G | NG | G | G | G | G |
| (3) | NG | — | NG | G | G | — | G | G | G | G |
| (4) | — | — | — | G | G | — | G | G | G | G |
| (5) | — | — | — | 2.1 | 7.5 | — | 6.1 | 7.4 | 7.8 | 6.2 |
| (6) | — | — | — | G | NG | — | NG | NG | NG | NG |
| (7) | — | — | — | G | NG | — | NG | NG | NG | NG |
| (8) | — | — | — | G | NG | — | NG | NG | NG | NG |

*3NG = no good
—: not measured due to bad result

TABLE 7

| Comparative Example No. | 11 | 12 | 13 | 14 | 15 | 16 | 17 | 18 | 19 | 20 | 21 | 22 |
|---|---|---|---|---|---|---|---|---|---|---|---|---|
| Daisodap A | 100 | 100 | 100 | 100 | 100 | 100 | 100 | 100 | 100 | 100 | 100 | 100 |
| Trimethylalpropane trimethacrylate | 20 | 20 | 20 | 20 | 20 | 20 | 20 | 20 | 20 | 20 | 20 | 20 |
| Epikote 152 | 15 | 15 | 15 | 15 | 15 | 15 | 15 | 15 | 15 | 15 | 15 | 15 |
| 4,4'-Bis(N,N'-diethylamino)-benzophenone | 0.5 | 0.5 | 0.5 | 0.5 | 0.5 | 0.5 | 0.5 | 0.5 | 0.5 | 0.5 | 0.5 | 0.5 |
| 2-Methyl-1-[4-(methylthil)-phenyl]-2-morpholino-1-propane-1 | 4 | 4 | 4 | 4 | 4 | 4 | 4 | 4 | 4 | 4 | 4 | 4 |
| Dicyandiamide | 1.5 | 1.5 | 0.5 | 1.5 | 1.5 | 1.5 | 1.5 | 1.5 | 1.5 | 1.5 | 1.5 | 1.5 |
| 2,4-Diamino-6[2'-methyl-imidazole-(1')]-ethyl-s-triazine | 0.18 | 0.18 | 0.18 | 0.18 | 0.18 | 0.18 | 0.18 | 0.18 | 0.18 | 0.18 | 0.18 | 0.18 |
| Phthalocyanine green | — | 0.05 | 0.5 | 0.5 | 0.5 | 0.5 | 0.5 | — | — | — | 12 | — |
| 4-t-Butyl-4'-methoxy-benzoylmethane | — | — | 6.0 | — | — | — | — | 3 | 3 | 3 | — | 6 |
| 2-Ethylhexyl p-methoxycinnamate | — | — | 6.0 | — | — | — | — | 3 | 3 | 3 | — | 6 |
| Silicone oil SH-203 | 5 | 5 | 5 | 0.2 | 15 | 5 | 5 | 5 | 5 | 5 | 5 | 5 |
| Aerosil A380 | 3 | 3 | 3 | 3 | 3 | 3 | 3 | 3 | 3 | 3 | 3 | 3 |
| Crystalite 5X | 50 | 50 | 50 | 50 | 50 | 50 | 50 | — | 10 | 120 | 50 | 50 |
| Ethyl Cellosolve acetate | 35 | 35 | 35 | 35 | 35 | 30 | 60 | 35 | 35 | 35 | 35 | 35 |
| Butyl Cellosolve acetate | 35 | 35 | 35 | 35 | 30 | 20 | 50 | 35 | 35 | 35 | 35 | 35 |

TABLE 7-continued

| Comparative Example No. | 11 | 12 | 13 | 14 | 15 | 16 | 17 | 18 | 19 | 20 | 21 | 22 |
|---|---|---|---|---|---|---|---|---|---|---|---|---|
| Properties | | | | | | | | | | | | |
| (1) | G | G | G | NG | G | NG | NG | G | G | NG | G | G |
| (2) | G | G | G | — | G | — | — | G | G | G | G | G |
| (3) | G | G | NG | — | NG | — | — | G | G | NG | NG | NG |
| (4) | NG | NG | — | — | — | — | — | NG | NG | — | — | — |
| (5) | 7.2 | 5.9 | — | — | — | — | — | 2.0 | 2.5 | — | — | — |
| (6) | G | G | — | — | — | — | — | NG | NG | — | — | — |
| (7) | G | G | — | — | — | — | — | NG | NG | — | — | — |
| (8) | G | G | — | — | — | — | — | NG | NG | — | — | — |

What is claimed is:

1. A photo curable diallyl phthalate resin composition for forming a solder resist
   (a) 100 parts by weight of a prepolymer of diallyl phthalate,
   (b) 4 to 30 parts by weight of a polyfunctional unsaturated compound obtained by esterification reaction of an unsaturated carboxylic acid with a polyhydroxy compound,
   (c) 0.5 to 12 parts by weight of a photopolymerization initiator,
   (d) 3 to 35 parts by weight of a solvent soluble epoxy resin,
   (e) 2 to 20 parts by weight per 100 parts by weight of the epoxy resin of a catalyst mixture for the epoxy resin comprising dicyandiamide and a diamino-triazine-modified imazole compound in a weight ratio of the former to the latter of 16/1 to 5/1 which is in a range enclosed by the lines A-B-C-D shown in FIG. 3,
   (f) 0.1 to 10 parts by weight of an agent, comprising at least one compound selected from the group consisting of 4-t-butyl-4'-methoxydibenzoylmethane, 2-ethylhexyl p-methoxycinnamate, 2-(2'-hydroxy-3',5'-di-tert-butyl-phenyl)benzotriazole, 2-(2'-hydroxy-3'-tert-butyl-5'-methylphenyl)-5-chlorobenzotriazole, 2-(2'-hydroxy-3',5'-tert-butylphenyl)-5-chlorobenzotriazole, and 2-Δ2'-hydroxy-3'-(3'',4'',5'', 6''-tetrahydrophthalimidomethyl)-5=-methylphenyl}benzotriazole or the at least one compound in combination with phthalocyanine green or phthalocyanine blue,
   (g) 0.5 to 10 parts by weight of an anti-foaming agent,
   (h) 20 to 100 parts by weight of a filler, and
   (i) 55 to 100 parts by weight of a solvent for dissolving said prepolymer of diallyl phthalate and said epoxy resin.

2. A composition according to claim 1, wherein the prepolymer of diallyl phthalate has a molecular weight of 3,000 to 30,000 and the polyfunctional unsaturated compound is at least one member selected from the group consisting of acrylates of hydroxy compounds, methacrylates of hydroxy compounds, oligomer ester acrylates, oligomer ester methacrylates, epoxy acrylates and epoxy methacrylates.

3. A composition according to claim 1, wherein the agent is phthalocyanine green or phthalocyanine blue in combination with said at least one compound.

4. A composition according to claim 1, wherein the filler is a very fine quartz powder having a particle size of 10 μm or less.

* * * * *